United States Patent [19]

Dearborn

[11] 4,138,785
[45] Feb. 13, 1979

[54] MACHINE FOR CLINCHING A MULTIPLE LEAD COMPONENT

[75] Inventor: Harold R. Dearborn, Belleville, Canada

[73] Assignee: Northern Telecom Limited, Montreal, Canada

[21] Appl. No.: 848,882

[22] Filed: Nov. 7, 1977

[51] Int. Cl.$^2$ .............................................. H05K 3/32
[52] U.S. Cl. .................................... 29/741; 29/761; 140/105; 228/15.1; 228/173 E
[58] Field of Search ................. 29/741, 739, 626, 761, 29/566.3, 714, 715; 140/105; 228/15.1, 173 E

[56] References Cited

U.S. PATENT DOCUMENTS

| 2,902,689 | 9/1959 | Petersen | 29/566.3X |
| 3,167,779 | 2/1965 | Ahearn | 29/741 |
| 3,435,857 | 4/1969 | Ragard et al. | 29/741 X |
| 3,550,238 | 12/1970 | Allen et al. | 29/741 X |

Primary Examiner—Carl E. Hall
Attorney, Agent, or Firm—Frank Turpin

[57] ABSTRACT

A clinching machine for clinching the leads of a connector on a circuit board includes a top wall which provides a work surface having an opening for receiving the leads and a clamp for clamping the circuit board and the connector in place against the work surface. A pair of clinching jaws, each having a pair of work faces intersecting at an angle of less than 90°, are pivotably mounted in fixed relationship adjacent to the opening. Pneumatic actuators first cause the clamp to engage the circuit board and the connector, and then cause the jaws to pivot, thereby drawing the leads into close contact with land areas on the circuit board. The amount of rotation of the jaws corresponds to the difference between the intersecting angle and 90°.

8 Claims, 4 Drawing Figures

MACHINE FOR CLINCHING A MULTIPLE LEAD COMPONENT

The invention relates to a clinching machine for use in the manufacture of printed circuit package assemblies and particularly to a machine for clinching the multiple leads of a component to a printed circuit board in one operation.

In mass production, printed circuit boards are typically assembled by automatic insertion machines which operate according to a series of instruction words. A printed circuit board is registered on the work table of the machine and the components are inserted one by one and the leads are clinched from beneath the work table one at a time. Typically, a circuit board will include a connector block for connecting the circuit board into a system. However, the typical connector is too bulky and too long to be inserted and clinched by the existing insertion machines. Hence the final assembly steps of inserting and clinching the connector component are accomplished through hand labour, after which, the circuit board is ready for wave soldering.

The hand labour portion of the assembly task has proven to be expensive and inefficient. After a while, a person doing the clinching task loses interest and no longer consistently clinches the connector lugs tightly and product quality suffers. Typically, this is noticed only after the circuit board is wave soldered and quite difficult and expensive to repair or rework.

It has been found that the hand labour portion of the assembly task may be reduced by a clinching machine which provides consistent results and which requires very little effort on the part of a machine operator.

In accordance with the present invention a clinching machine for clinching an in-line multiple lead component to a circuit board comprises a work surface having an opening for receiving the leads of the component protruding through a printed circuit board. An actuatable clamping means engages and retains the circuit board and the component in a predetermined position. A clinching means includes a clinching jaw having a tip portion defined by work faces intersecting at an inside angle of less than 90°. The clinching jaw is pivotably fixed relative the work surface so as to be adjacent the surface of the printed circuit board. An actuating means is responsive to actuation of the clamping means to cause the clinching jaw to rotate so that one of the work faces is rotated into a parallel relationship with the work surface. The component leads met by the work face of the clinching jaw are bent into substantially close contact with the associated land areas of the printed circuit board.

The first and second work faces of the clinching jaw meet at an intersection to describe an acute interior angle, the surface of the intersection having a radius sufficiently large to prevent the lugs from being sheared off and sufficiently small to cause the lugs to be drawn against associated land areas on the printed circuit board. When the component is clamped to the circuit board with its leads extending therethrough parallel to and closely adjacent the first work surface, the clinching jaw is rotated against the leads through an arc corresponding to the difference between the acute angle and a right angle whereby each lead is drawn against its associated land area.

An example embodiment of the invention will now be described with reference to the accompanying drawings in which.

In reference to the drawings, some details illustrated in one drawing (for simplicity) may not be present in another drawing.

Figure 1:
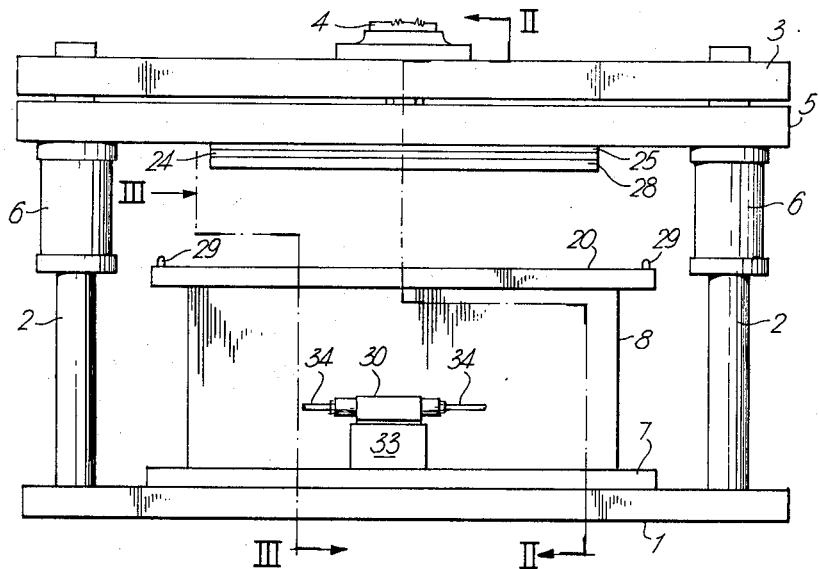
FIG. 1 is a front elevational view of a clinching machine in accordance with the invention.

In FIG. 1, a base 1 carries a pair of columns 2 at each end thereof. The columns 2 are substantially normal to the base. The top portions of the columns 2 carry a bridge member 3 adjustably fixed therebetween. A first cylinder 4 is mounted on the bridge member 3, with the movable portion, a shift member 5a, of the cylinder 4 protruding through the bridge member 3. A movable bridge member 5 is fixed on bushings 6 which are slidably carried by the columns 2. The position of the bridge member 5 relative the bridge member 3 is determined by the position of the shaft member 5a, to which it is attached.

Figure 2:
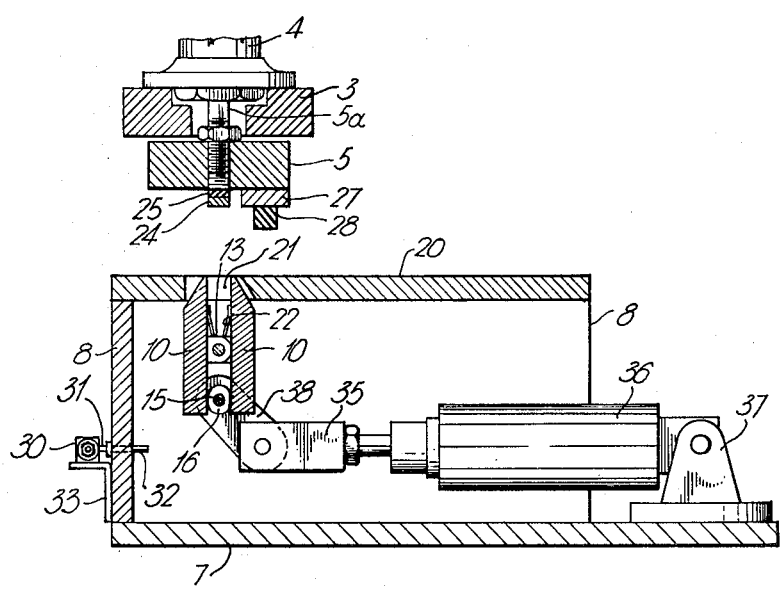
FIG. 2 is a partial cross-sectional view of FIG. 1 taken along a line II—II.
Figure 3:
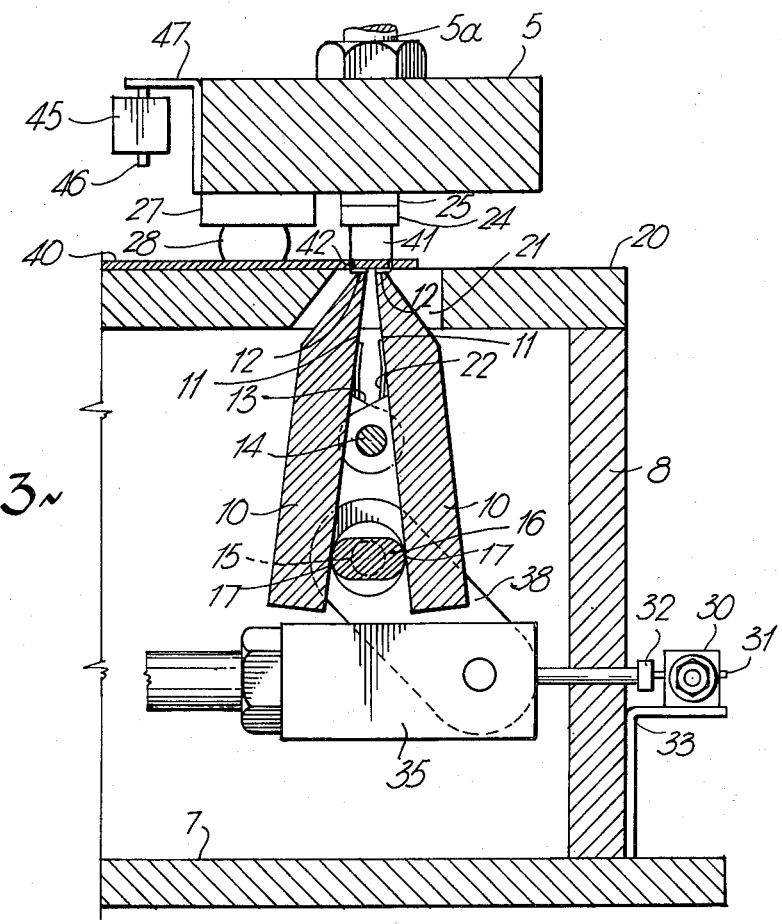
FIG. 3 is a partial cross-sectional view of FIG. 1 taken along a line III—III.

In the following description of the clinching machine the detailed structure and the function of the machine will become apparent with reference to FIGS. 1, 2 and 3 in combination. The clinching machine includes a baseplate 7 mounted upon the base 1. Side and front walls 8 carry a top wall 20. A work surface is provided by the top wall 20 and includes an opening 21 therein. Directly under the opening 21, a pair of clinching jaws 10 are carried via hinge flanges 13 on a common hinge pin 14 which is supported by the side walls 8. A plurality of spring devices 22 are carried by the hinge pin 14 and serve to urge the jaws 10 apart. Each clinching member or jaw 10 includes a work face 11 which intersects with another work face 12. The intersection between the work face 11 and the work face 12 defines an interior angle of less than 90°. A second cylinder 36 is mounted on the baseplate 7 via a pivot joint 37. The second cylinder 36 includes a movable arm or member 35, to which a lever 38 is rotatably fixed. The end of the lever 38 remote the member 35 is fixed to an axle 15 which is rotatably carried by the side walls 8. The axle 15 includes a camming formation 16 which approximates an oval or elliptical-like form. In FIG. 3, the camming formation 16 is shown contacting with the jaws 10 at points 17. The movable member 35 is at its furthest forward extension toward the front wall 8, and in this position engages with a pin 32 protruding through the front wall 8. The limit switch 30 includes a switch member 31. Adjacent the pin 32, a limit switch 30 is fixed to the front wall 8 by a bracket 33. Conduit 34 provides for pneumatic flow to and from the limit switch 30. The full required extension of the member 35 is transmitted to the limit switch 30 via travel engagement of the pin 32 and actuation of the switch member 31.

Above the top wall 20, as the shaft member 5a extends, an elongated bar of resilient material 28, fastened to the bridge 5 travels toward the work surface of the top wall 20. When a printed circuit board 40 is placed upon the work surface 20 it is clamped against the work surface 20, as illustrated in FIG. 3. At the fullest extension of the shaft member 5a, the resilient material 28 serves to positively and firmly retain the printed circuit board 40 against the work surface of the top wall 20. The limit of extension of the bridge member 5 and the associated elements toward the work surface and the opening 21 is determined by the position at which the bridge member 5 is fixed.

A limit switch 45 is mounted in fixed relationship to the top wall 20. The limit switch 45 includes a switch member 46 which is actuated by a bracket 47 carried by the bridge member 5 at its fullest extension toward the top wall 20. In reference to FIG. 1 the limit switch and the associated hardware are not shown as the switch position is substantially hidden behind the right hand column 2 and bushing 6. Alternately the position of the limit switch can be lowered to below the level of the top wall 20 if the bracket 47 is fixed to the bushing 6 instead of the bridge member 5.

The circuit board 40 in FIG. 3 carries an elongated connector block 41 having two rows of terminals or lugs 42 protruding through the printed circuit board. The clinching machine includes a steel strip 24 resiliently mounted on the bridge 5 by a strip of resilient material 25. Clamping pressure is exerted through the steel strip 24 against the block of the connector 41 to maintain it firmly in place. This clamping action takes place prior to the jaws 10 being actuated as illustrated in FIG. 3. Until the limit switch 45 is actuated by movement of the bridge member 5, the jaws 10 remain in the rest position as illustrated in FIG. 2.

When the jaws 10 are actuated the work faces 11 first contact the lugs 42. As the jaws are further actuated the fairly abrupt intersection between the work faces 11 and 12 cause the lugs to be rolled upwardly and to be drawn parallel to the circuit board 40 and in contact with land areas thereon (not shown). At this point, the member 35 is at its fullest extension and this is sensed by the limit switch 30. This causes the slidable bridge 5 to withdraw thereby releasing the circuit board 40 and the connector block 41.

The limit switch 45 is thus returned to its rest position causing the shaft 35 to be withdrawn into the cylinder 36 and in sequence the jaws 10 to be returned to their rest position by the spring devices 22.

The jaws 10 of the clinching machine may be made of hardened tool steel material, for example either air tempering steel or preferably oil tempering steel. Jaws of air tempering steel were satisfactorily shaped, heat treated and ground, so that the acute angle between surfaces 11 and 12 were of an approximate radius of about 0.2 to 0.3 mm.

In operation this radius was found to facilitate a drawing like action upon the lugs while substantially avoiding any tendency to shear the lugs.

Figure 4:
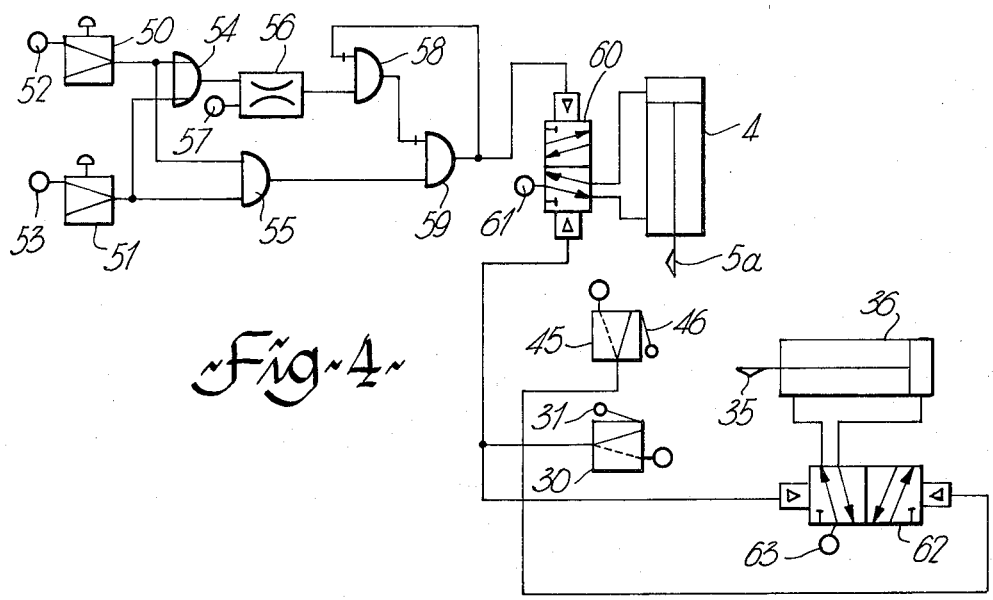
FIG. 4 is a pneumatic schematic diagram of the clinching machine in FIG. 1.

The schematic in FIG. 4 illustrates a pneumatic arrangement for operating the clinching machine. The cylinders 4 and 36 and the limit switches 45 and 30 are arranged so that a predetermined extension of the respective members 5a and 35 operate the switch members 46 and 31 respectively. Initially the members 5a and 35 are withdrawn into their respective cylinders. Control switches 50 and 51 are placed conveniently with respect to the machine. Actuation of these switches 50 and 51 allows a pneumatic flow to occur via ports 52 and 53 respectively. The outputs of the switches 50 and 51 are both connected with separate inputs of an OR element 54 and separate inputs of an AND element 55. The output of the OR element 54 is connected to the input of a time delay device 56. This particular delay device was selected to impart a time delay of about 0.2 sec. before the effect of the initial actuation of one of the control switches 50 and 51 is passed on to an input of a NOT element 58. The output of the NOT element 58 is connected to a negative input of a NOT element 59 and the output of the AND element 55 is connected to an input of the NOT element 59. The output of the NOT element 59 is connected to a negative input of the NOT element 58 and to a control input of a four-way valve 60. The four-way valve 60 is connected in arrangement with the pneumatic cylinder 4 to cause the required operation thereof depending upon a supply of pneumatic pressure at an input port 61 and pneumatic signals received from the NOT element 59 and the limit switch 30. Likewise, a four-way valve 62 with an input port 63 is connected in arrangement with the cylinder 36 to cause operation thereof according to pneumatic signals from the limit switches 45 and 30.

In operation, the elements 54 and 59 ensure that substantially simultaneous actuation of the switches 50 ad 51 is required to operate the clinching machine. If the switches 50 and 51 are actuated more than about 0.2 second apart, the clinching machine fails to operate. These switches 50 and 51 are placed such that an operator's hands must be away from the moving parts of the machine in order to actuate the clinching operation.

Assuming the clinching operation is initiated, a signal from the output of the NOT element 59 causes the member 5a to move the clamping surfaces of members 24 and 28 toward the work surface of the top wall 20. Eventually, the member 46 is actuated, sending a signal from the limit switch 45 to actuate the member 35. This causes the jaws 10 to be rotated and the member 31 to be actuated. The resulting output from the limit switch 30 causes the bridge member 5a to retreat to its rest position and the resulting output from the limit switch 45 causes the member 35 to retreat to its rest position.

Although the clinching machine is described as being operated by pneumatic means, it should be understood that other means for example hydraulic or electrical, may well be suitable for the operations of a clinching machine designed to incorporate features as herein described.

What is claimed is:

1. A clinching machine for fastening a connector to a printed circuit board in preparation for wave soldering the printed circuit board, said connector having an elongated row of terminal lugs extending therefrom and the circuit board having a plurality of land areas for receiving the terminal lugs, the clinching machine comprising:

a work surface having an opening therein for receiving terminal lugs protruding through the printed circuit board, clamping means for engaging and retaining the circuit board and the connector in fixed relationship to the work surface, clinching means including a clinching jaw having a tip portion defined by work faces intersecting at an inside angle of less than 90°, the clinching jaw being pivotably fixed relative the work surface so as to be closely adjacent the surface of the printed circuit board in the area of the opening, actuating means responsive to clamping actuation of the clamping means for causing the clinching jaw to rotate a predetermined amount, whereby terminal lugs met by the clinching jaw are drawn into close and substantially parallel contact with the associated land areas.

2. A clinching machine as defined in claim 1, in which the clinching means comprises a pair of clinching jaws rotatably mounted in complementary relationship and in which the actuating means includes a camming means in mechanical association with the clinching jaws and spring means for urging the tips of the jaws apart one from the other.

3. A clinching machine as defined in claim 1 in which the clamping means includes a first resilient member for bearing against the circuit board, a second resilient member for bearing against the connector, said second resilient member comprising a resilient material carrying a substantially rigid surface for contact with a connector whereby local distortion of the connector during the operation of the clinching machine is substantially prevented.

4. A clinching machine as defined in claim 2 in which the clamping means includes a first resilient member for bearing against the circuit board, a second resilient member for bearing against the connector, said second resilient member comprising a resilient material carrying a substantially rigid surface for contact with a connector whereby local distortion of the connector during the operation of the clinching machine is substantially prevented.

5. A clinching machine as defined in claim 2 in which the actuation of the actuating means is determined by a first limit switch means and the moment of withdrawal of the clamping means is determined by the impingement of the actuating means against a second limit switch means, said clamping means being responsive to actuation of said second limit switch means, to release the circuit board and the connector.

6. A clinching machine as defined in claim 3 in which the actuation of the actuating means is determined by a first limit switch means and the moment of withdrawal of the clamping means is determined by the impingement of the actuating means against a second limit switch means, said clamping means being responsive to actuation of said second limit switch means, to release the circuit board and the connector.

7. A clinching machine as defined in claim 1 in which the intersection between the work faces is of a radius sufficiently large to prevent the lugs from being sheared off and sufficiently small to cause the lugs to be drawn against the associated land areas of the printed circuit board.

8. A clinching machine as defined in claim 1 in which the jaw is of a hardened tool steel material having a radius between the work faces of about 0.2 mm to 0.3 mm.

* * * * *